United States Patent
Usui et al.

(10) Patent No.: US 9,225,364 B1
(45) Date of Patent: Dec. 29, 2015

(54) DISTORTION COMPENSATION METHOD, DISTORTION COMPENSATION APPARATUS, AND NON-TRANSITORY COMPUTER READABLE STORAGE MEDIUM

(71) Applicant: FUJITSU LIMITED, Kawasaki-shi, Kanagawa (JP)

(72) Inventors: Hisashi Usui, Yokohama (JP); Takashi Ohashi, Yokohama (JP); Toru Taniguchi, Kawasaki (JP); Kazuyuki Koshida, Kawasaki (JP); Masato Matsumoto, Kawasaki (JP); Masayuki Harada, Kawasaki (JP); Nozomu Nishiguchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/565,154

(22) Filed: Dec. 9, 2014

(30) Foreign Application Priority Data

Aug. 25, 2014  (JP) .................................. 2014-170787

(51) Int. Cl.
*H04B 1/62* (2006.01)
*H04B 1/04* (2006.01)

(52) U.S. Cl.
CPC ...... *H04B 1/0475* (2013.01); *H04B 2001/0425* (2013.01)

(58) Field of Classification Search
CPC .......... H04B 1/04; H04B 1/0475; H04B 1/62; H04B 2001/0408; H04B 2001/0416; H04B 2001/0425; H04B 2001/0433; H04B 2001/0441; H04B 2001/045

USPC ........................................ 375/295, 296, 297
See application file for complete search history.

(56) References Cited

U.S. PATENT DOCUMENTS

| | | | | |
|---|---|---|---|---|
| 5,852,630 | A * | 12/1998 | Langberg et al. | 375/219 |
| 6,489,846 | B2 * | 12/2002 | Hatsugai | 330/149 |
| 2005/0047521 | A1 * | 3/2005 | Ishikawa et al. | 375/296 |
| 2005/0073361 | A1 * | 4/2005 | Hamada et al. | 330/149 |
| 2005/0253745 | A1 * | 11/2005 | Song et al. | 341/118 |
| 2008/0197925 | A1 * | 8/2008 | Furuta et al. | 330/149 |
| 2010/0119889 | A1 * | 5/2010 | Luepke et al. | 429/13 |
| 2012/0147991 | A1 | 6/2012 | Matsubara et al. | |
| 2013/0015917 | A1 | 1/2013 | Ishikawa et al. | |

FOREIGN PATENT DOCUMENTS

| | | |
|---|---|---|
| JP | 2006-279528 A | 10/2006 |
| JP | 2007-208684 A | 8/2007 |
| JP | 2012-129661 A | 7/2012 |
| JP | 2013-26631 A | 2/2013 |
| WO | WO 2006/033256 A1 | 3/2006 |

* cited by examiner

*Primary Examiner* — Siu Lee
(74) *Attorney, Agent, or Firm* — Arent Fox LLP (57) ABSTRACT

In a distortion compensation apparatus, a monitor unit monitors a power value of a transmission baseband signal. An update control unit does not allow an updating unit to execute update processing when the power value monitored by the monitor unit is lower than a first threshold, and causes the updating unit to execute the update processing when higher than the first threshold. That is, the update control unit controls execution/non-execution of the update processing by the updating unit based on the monitored power value.

4 Claims, 11 Drawing Sheets

| FIRST DIMENSION (X AXIS) | SECOND DIMENSION (Y AXIS) | COMBINED ADDRESS |
|---|---|---|
| X(p0) | Y($\theta$0) | a1 |
| ⋮ | Y($\theta$1) | a1 |
| ⋮ | ⋮ | ⋮ |
| ⋮ | ⋮ | ⋮ |
| X(pn-1) | Y($\theta$n-2) | a255 |
| X(pn-1) | Y($\theta$n-1) | a256 |

FIG.5

| COMBINED ADDRESS | DISTORTION COMPENSATION COEFFICIENT |
|---|---|
| a1 | h1(p) |
| a2 | h2(p) |
| ⋮ | ⋮ |
| a255 | h255(p) |
| a256 | h256(p) |

FIG.6

|  | UPDATE PROCESSING EXECUTION |
|---|---|
| MONITORED POWER VALUE ≥ α | ○ |
| α > MONITORED POWER VALUE | × |

|  | STATE |
|---|---|
| MONITORED POWER VALUE≥ γ dBm | 1 |
| γ dBm>MONITORED POWER VALUE≥ β dBm | 0 |
| β dBm>MONITORED POWER VALUE | 2 |

FIG.12

| STATE OF THIS TIME \ HELD STATE | 1 | 0 | 2 |
|---|---|---|---|
| 1 | NO PROCESSING | NO PROCESSING | (1) SWITCH ADDRESS CORRESPONDENCE TABLE (2) INITIALIZE DISTORTION COMPENSATION COEFFICIENT (3) UPDATE HELD DATA |
| 2 | (1) SWITCH ADDRESS CORRESPONDENCE TABLE (2) INITIALIZE DISTORTION COMPENSATION COEFFICIENT (3) UPDATE HELD DATA | NO PROCESSING | NO PROCESSING |

DISTORTION COMPENSATION METHOD, DISTORTION COMPENSATION APPARATUS, AND NON-TRANSITORY COMPUTER READABLE STORAGE MEDIUM

CROSS-REFERENCE TO RELATED APPLICATION(S)

This application is based upon and claims the benefit of priority of the prior Japanese Patent Application No. 2014-170787, filed on Aug. 25, 2014, the entire contents of which are incorporated herein by reference.

FIELD

The embodiments discussed herein are related to a distortion compensation method, a distortion compensation apparatus, and a distortion compensation program.

BACKGROUND

In wireless transmission apparatuses in a wireless communication system, an amplifier to amplify power of a transmission signal is equipped. In the wireless transmission apparatus, generally, an amplifier is operated near the saturation region of the amplifier to enhance power efficiency of the amplifier. However, when an amplifier is operated near the saturation region, nonlinear distortion increases. Therefore, to reduce adjacent channel leakage power (adjacent power leakage ratio (ACLR)) by suppressing this nonlinear distortion, a distortion compensation apparatus that compensates nonlinear distortion is equipped in the wireless communication apparatus.

As one of distortion compensation schemes used in a distortion compensation apparatus, there is a "pre-distortion (hereinafter, referred to as "PD" in some cases) scheme". The distortion compensation apparatus applying the PD scheme suppresses distortion in output of an amplifier by enhancing linearity of output of the amplifier by multiplying a transmission baseband signal before input to the amplifier by a distortion compensation coefficient that has inverse characteristics of nonlinear distortion of the amplifier. A signal obtained by multiplying the transmission baseband signal by the distortion compensation coefficient is referred to as a "pre-distortion signal (PD signal)" in some cases. Therefore, the PD signal is a signal distorted in advance according to the inverse characteristics of the nonlinear distortion of the amplifier before being input to the amplifier.

For example, as the distortion compensation apparatus of the PD scheme, one that has a lookup table (hereinafter, "LUT" in some cases) in which distortion compensation coefficients are stored, and that reads a distortion compensation coefficient from the LUT, specifying an address corresponding to power of a transmission baseband signal to the LUT is available. The distortion compensation coefficient stored in the LUT is sequentially updated such that an error between a signal that is obtained by comparing a transmission baseband signal as a reference signal and a signal that is output from the amplifier and fed back thereto (hereinafter, "feedback signal" in some cases") is minimized. Conventional examples are described in International Publication Pamphlet No. WO 2006/033256 and Japanese Laid-open Patent Publication No. 2007-208684.

At the comparison between a transmission baseband signal as a reference signal and a feedback signal, adjustment processing to match timing and phase of the both signals is performed. Because transmission time in the apparatus can be regarded as unchangeable to be constant, timing adjustment processing to match the timing of the both signals may be performed, for example, before sell-in. On the other hand, the phase characteristics of electronic parts (for example, an amplifier) in the apparatus vary according to ON/OFF of the apparatus or with time, and therefore, phase adjustment processing of the both signals is performed each time.

However, noise components can be superimposed on a feedback signal (that is, an output signal of the amplifier being a transmission signal), and when power of the feedback signal is small, the feedback signal can be buried in the noise components. In this case, the phase-specific accuracy using the feedback signal is deteriorated, and the accuracy of the phase adjustment processing can be deteriorated. As a result, the accuracy of the distortion compensation processing can be deteriorated.

SUMMARY

According to an aspect of an embodiment, an update value of a distortion compensation coefficient is calculated based on an input transmission signal and an output signal of an amplifier corresponding to the input transmission signal, and when a power value of the input transmission signal is lower than a first threshold, update processing to update a distortion-compensation coefficient table that stores distortion compensation coefficients that respectively correspond to first address values is not executed, and when the power value of the input transmission signal is equal to or higher than the first threshold, the update processing is executed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The distortion compensation method, the distortion compensation apparatus, and the distortion compensation program disclosed in the present application are not limited to the embodiments. Moreover, in the embodiments, like reference symbols refer to like parts, and duplicated explanation is omitted.

[a] First Embodiment

Configuration Example of Wireless Transmission Apparatus

Figure 1:
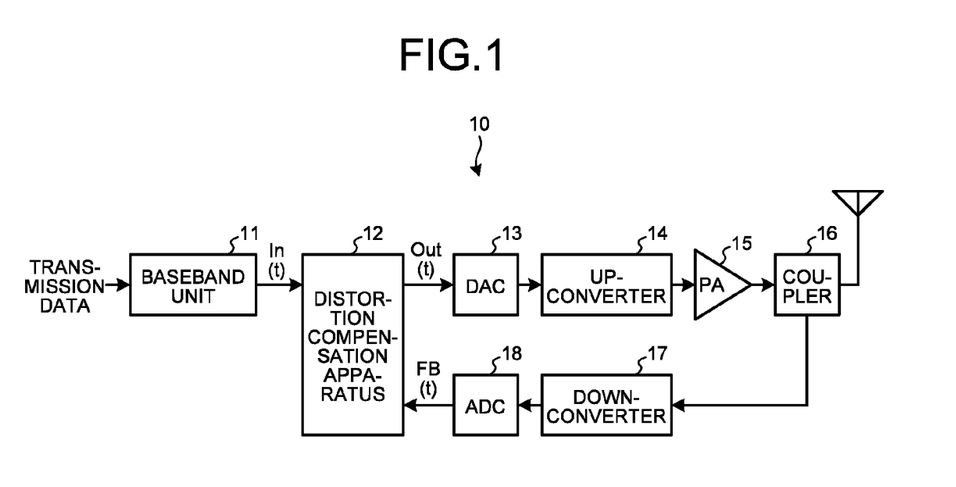
FIG. 1 is a block diagram indicating one example of a wireless transmission apparatus that includes a distortion compensation apparatus of a first embodiment.

FIG. 1 is a block diagram indicating one example of a wireless transmission apparatus that includes a distortion compensation apparatus of a first embodiment. As indicated in FIG. 1, a wireless transmission apparatus 10 includes a baseband unit 11, a distortion compensation apparatus 12, a digital-to-analog converter (DAC) 13, an up-converter 14, a power amplifier (PA) 15, and a coupler 16. Furthermore, the wireless transmission apparatus 10 includes a down-converter 17, and an analog-to-digital converter (ADC) 18.

The wireless transmission apparatus 10 is, for example, equipped in a wireless communication terminal device used in a wireless communication system, or in a wireless communication base station, and the like.

The baseband unit 11 generates a transmission baseband signal by performing baseband processing, such as encoding processing and modulation processing, on an input transmission signal, and outputs a generated transmission baseband signal In(t) to the distortion compensation apparatus 12.

The distortion compensation apparatus 12 is a distortion compensation apparatus of the PD scheme, and has an LUT in which distortion compensation coefficients are stored respectively corresponding to addresses that correspond to power regions. The distortion compensation apparatus 12 refers to the LUT according to an address that is generated according to power of the transmission baseband signal, and multiplies the transmission baseband signal by a distortion compensation coefficient read from the LUT to generate a PD signal Out(t), and outputs the generated PD signal Out(t) to the DAC 13. Moreover, the distortion compensation apparatus 12 updates the distortion compensation coefficient stored in the LUT based on an error between the transmission baseband signal In(t) as a reference signal and a feedback signal FB(t).

The DAC 13 converts the PD signal from a digital signal to an analog signal and outputs to the up-converter 14.

The up-converter 14 up-converts the analog PD signal, and outputs the PD signal subjected up-conversion to the PA 15.

The PA 15 amplifies power of the PD signal subjected to the up-conversion, and outputs the signal subjected to amplification of power to the coupler 16.

The coupler 16 distributes the signal subjected to power amplification to an antenna and a feedback path (that is, the down-converter 17). Thus, the signal output from the PA 15 is fed back to the distortion compensation apparatus 12 through the down-converter 17 and the ADC 18.

The down-converter 17 down-converts the signal input from the coupler 16, and outputs the signal subjected to down-conversion to the ADC 18.

The ADC 18 converts the signal subjected to down-conversion from an analog signal to a digital signal, and outputs the converted digital signal to the distortion compensation apparatus 12 as the feedback signal FB(t).

Configuration Example of Distortion Compensation Apparatus

Figure 2:
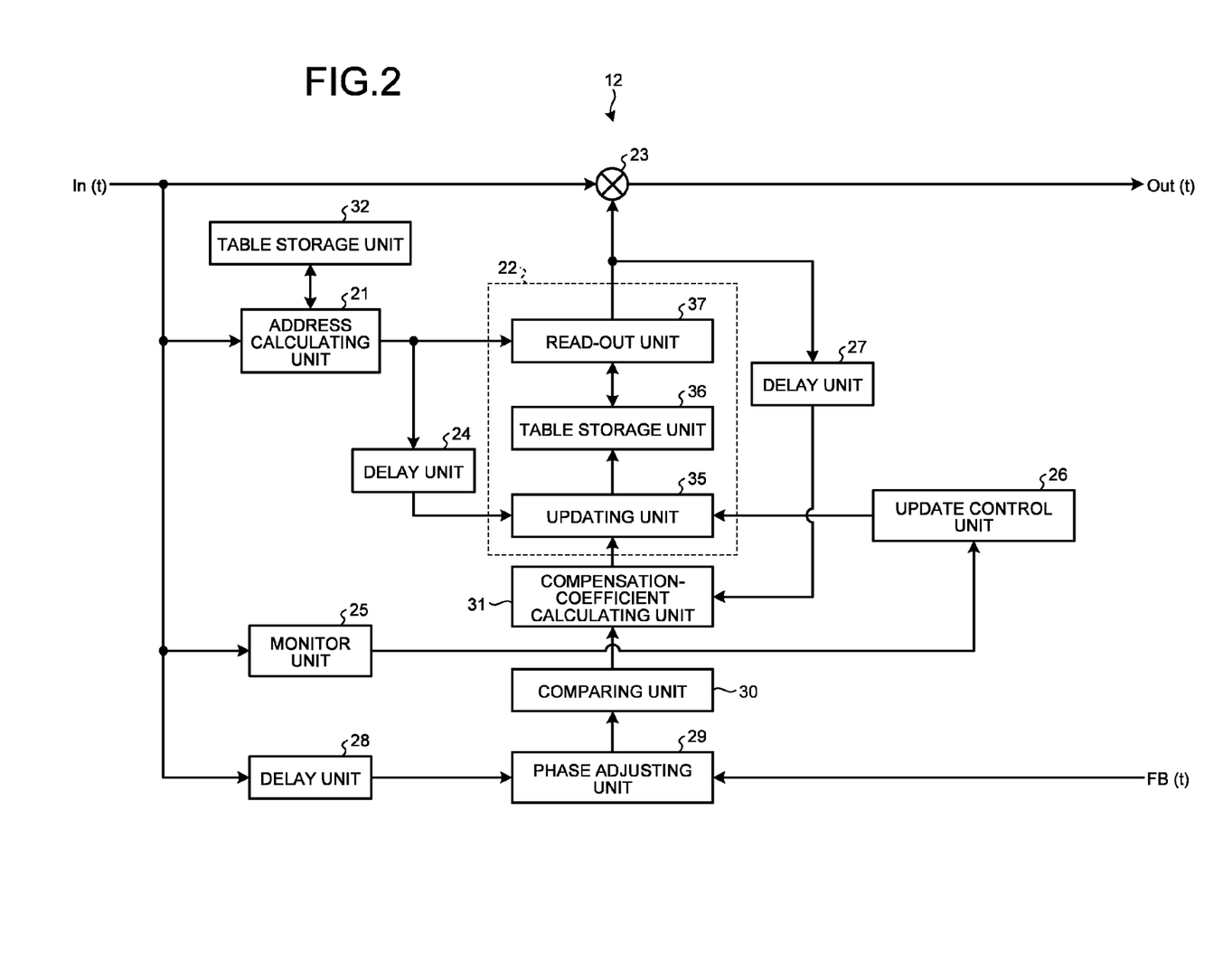
FIG. 2 is a block diagram indicating one example of the distortion compensation apparatus of the first embodiment.

FIG. 2 is a block diagram indicating one example of the distortion compensation apparatus of the first embodiment. As indicated in FIG. 2, the distortion compensation apparatus 12 includes an address calculating unit 21, an LUT 22, a multiplier 23, a delay units 24, 27, and 28, a monitor unit 25, an update control unit 26, a phase adjusting unit 29, a comparing unit 30, a compensation-coefficient calculating unit 31, and a table storage unit 32.

The address calculating unit 21 calculates a first address (that is, an X-axis direction address) based on a power value of the transmission baseband signal In(t). Moreover, the address calculating unit 21 calculates a second address (that is, a Y-axis direction address) based on phase of the transmission baseband signal In(t). The address calculating unit 21 then identifies (calculates) a "combined address" that is associated with a combination of the calculated X-axis direction address and the Y-axis direction address in an "address correspondence table".

Figure 3:
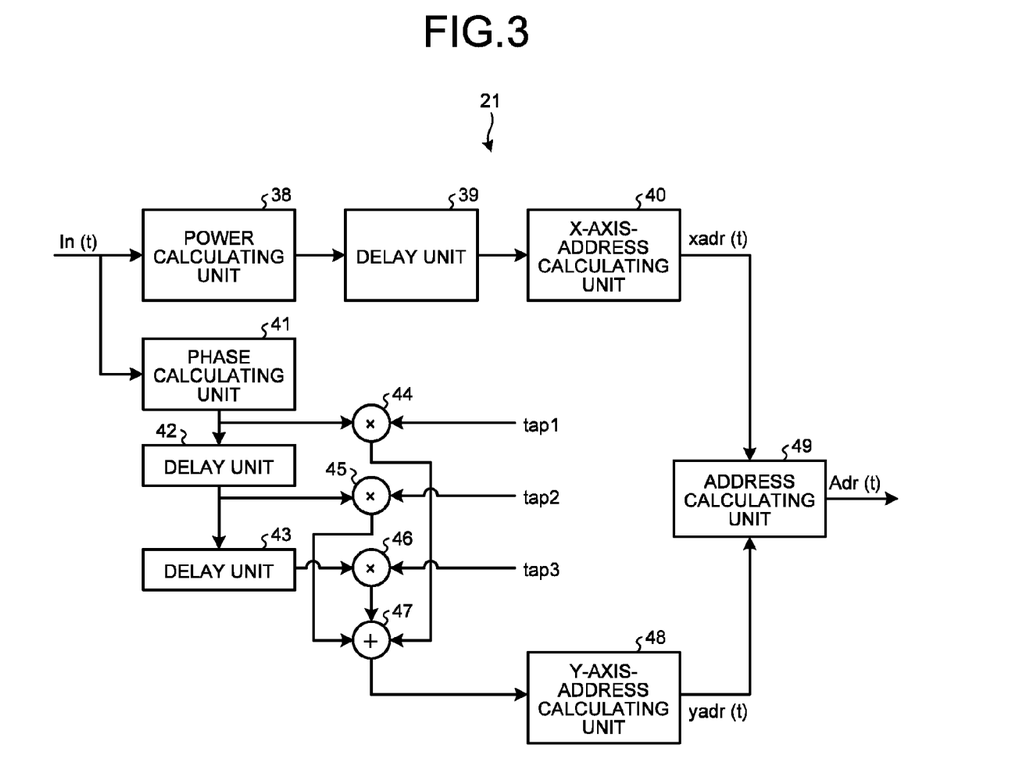
FIG. 3 is a block diagram indicating one example of an address calculating unit of the first embodiment.

FIG. 3 is a block diagram indicating one example of an address calculating unit of the first embodiment. As indicated in FIG. 3, the address calculating unit 21 includes a power calculating unit 38, delay units 39, 42, and 43, an X-axis-address calculating unit 40, a phase calculating unit 41, multipliers 44, 45, and 46, an adder 47, a Y-axis-address calculating unit 48, and an address calculating unit 49.

The power calculating unit 38 calculates power p ($=x^2(t)$) of the input baseband signal In(t). The power calculating unit 38 outputs power data that indicates the calculated power p to the delay unit 39.

The delay unit 39 outputs the power data that is output from the power calculating unit 38 with delay of predetermined time (for example, one sample) to the X-axis-address calculating unit 40.

The X-axis-address calculating unit 40 calculates an X-axis direction address by normalizing the power data that is output from the delay unit 39, and outputs a calculated X-axis direction address xadr(t) to the address calculating unit 49.

The phase calculating unit 41 calculates phase θ of the input baseband signal In(t). The phase calculating unit 41 outputs phase data indicating the calculated phase θ to the delay unit 42 and the multiplier 44.

The delay unit 42 outputs the phase data that is output from the phase calculating unit 41 with delay of predetermined time (for example, one sample) to the delay unit 43 and the multiplier 45. The delay unit 43 outputs the phase data that is output from the delay unit 42 with delay of predetermined time (for example, one sample) to the multiplier 46.

The multiplier 44 multiplies the phase data that is output from the phase calculating unit 41 by a tap coefficient tap1 to output to the adder 47.

The multiplier 45 multiplies the phase data that is output from the delay unit 42 by a tap coefficient tap2 to output to the adder 47.

The multiplier 46 multiplies the phase data that is output from the delay unit 43 by a tap coefficient tap3 to output to the adder 47.

The adder 47 adds signals that are output from the respective multipliers 44, 45, and 46. A result of addition by the adder 47 indicates a phase difference Δθ of the input baseband signal In(t) at three different time points (timing). The adder 47 outputs the result of addition to the Y-axis-address calculating unit 48 as phase difference data.

The Y-axis-address calculating unit 48 calculates a Y-axis direction address by normalizing the phase difference data that is output from the adder 47. The Y-axis-address calculating unit 48 outputs a calculated Y-axis direction address yadr (t) to the address calculating unit 49. As described, a Y-axis direction address is generated based on a difference between a phase calculated by the phase calculating unit 41 and a phase that is obtained by delaying the calculated phase by predetermined time (for example, one sample).

The address calculating unit 49 combines the X-axis direction address xadr(t) that is output from the X-axis-address calculating unit 40 and the Y-axis direction address yadr(t) that is output from the Y-axis-address calculating unit 48, and outputs a combined address Adr(t) thus combined. For example, the address calculating unit 49 identifies (calculates) a "combined address" that is associated with a combination of the calculated X-axis direction address xadr(t) that is output from the X-axis-address calculating unit 40 and the Y-axis direction address yadr(t) that is output from the Y-axis-address calculating unit 48 in the "address correspondence table", and outputs the identified "combined address".

Figure 4:
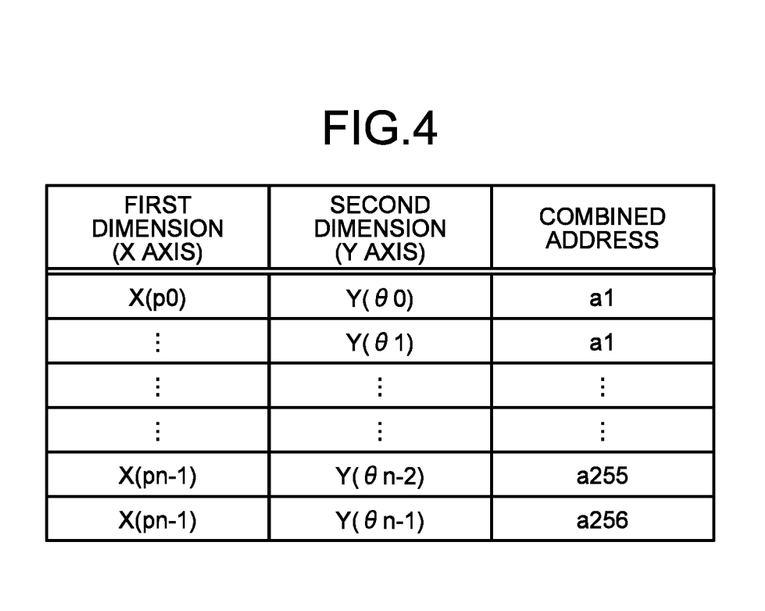
FIG. 4 is a diagram indicating one example of an address correspondence table.

Returning back to explanation of FIG. 2, the table storage unit 32 stores the "address correspondence table". FIG. 4 is a diagram indicating one example of an address correspondence table. As indicated in FIG. 4, in the address correspondence table, a "combined address" that is associated with each of "combination candidates" of candidates of an X-axis direction address and candidates of a Y-axis direction address is stored.

Returning back to explanation of FIG. 2, the LUT 22 reads a distortion compensation coefficient that corresponds to the address Adr(t) calculated by the address calculating unit 21 from the distortion-compensation coefficient table, and outputs the read distortion compensation coefficient to the multiplier 23 and the delay unit 27. Furthermore, the LUT 22 updates the distortion-compensation coefficient table using an update value of the distortion compensation coefficient that is calculated by the compensation-coefficient calculating unit 31 and an update address that is received from the delay unit 24.

For example, the LUT 22 includes, as indicated in FIG. 2, an updating unit 35, a table storage unit 36, and a read-out unit 37.

The updating unit 35 performs update processing to update the distortion-compensation coefficient table using the update value that is calculated by the compensation-coefficient calculating unit 31 and the update address that is received from the delay unit 24. The updating unit 35 executes the update processing when receiving an "execution command signal" for the update processing from the update control unit 26, and suspends the update processing when receiving a "suspension command signal" for the update processing from the update control unit 26.

Figure 5:
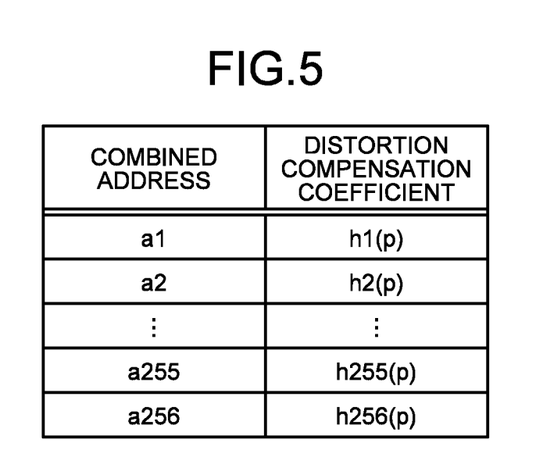
FIG. 5 is a diagram indicating one example of a distortion-compensation coefficient table of the first embodiment.

The table storage unit 36 stores the "distortion-compensation coefficient table" in which distortion compensation coefficients corresponding to respective address values (that is, combined addresses) are stored. FIG. 5 is a diagram indicating one example of the distortion-compensation coefficient table of the first embodiment.

The read-out unit 37 reads out a distortion compensation coefficient that corresponds to the address Adr(t) calculated by the address calculating unit 21 from the distortion-compensation coefficient table, and outputs the distortion compensation coefficient read out therefrom to the multiplier 23 and the delay unit 27.

The multiplier 23 multiplies the transmission baseband signal In(t) by the distortion compensation coefficient from the LUT 22, and outputs the transmission baseband signal In(t) subjected to distortion compensation processing (that is, the PD signal Out(t)) to the DAC 13.

The delay unit 24 delays the address Adr(t) by a delay amount d1, and outputs the delayed address Adr(t) to the updating unit 35 as an update address. The delay amount d1 corresponds to the total amount of processing delay in the multiplier 23, the ADC 18, the up-converter 14, the PA 15, the coupler 16, the down-converter 17, the ADC 18, the phase adjusting unit 29, the comparing unit 30, and the compensation-coefficient calculating unit 31.

The monitor unit 25 detects (monitors) a power value of the input baseband signal In(t), and outputs the detected power value to the update control unit 26.

The update control unit 26 controls execution/non-execution of the update processing by the updating unit 35 based on the detected power value that is received from the monitor unit 25. For example, the update control unit 26 compares the detected power value received from the monitor unit 25 with a "first threshold". When the detected power value received from the monitor unit 25 is lower than the "first threshold", the update control unit 26 outputs the "suspension command signal" to the updating unit 35 so that the update processing is not executed. On the other hand, when the detected power value received from the monitor unit 25 is equal to or higher than the "first threshold", the update control unit 26 outputs the "execution command signal" to cause the updating unit 35 to execute the update processing. The update control unit 26 may perform control to suspend a part or all of the processing of the phase adjusting unit 29, the comparing unit 30, and the compensation-coefficient calculating unit 31, during a period in which the update processing of the updating unit 35 is suspended.

The "first threshold" may be a value that corresponds to the nonlinear region of the PA 15. Moreover, the update control unit 26 detects a power value of a noise component that is superimposed on the feedback signal, and may adjust the "first threshold" according to the detected power value of the noise component. That is, the update control unit 26 may adjust the "first threshold" to be higher as the detected power value of the noise component increases, and may adjust the "first threshold" to be lower as the detected power value of the noise component decreases.

The delay unit 27 delays the distortion compensation coefficient that is output from the LUT 22 by a delay amount d2, and outputs the delayed distortion compensation coefficient to the compensation-coefficient calculating unit 31. The delay amount d2 corresponds to the total amount of processing delay in the multiplier 23, the DAC 13, the up-converter 14, the PA 15, the coupler 16, the down-converter 17, the ADC 18, the phase adjusting unit 29, and the comparing unit 30.

The delay unit 28 delays the transmission baseband signal In(t) as the reference signal by a delay amount d3, and output the delayed reference signal to the phase adjusting unit 29. The delay amount d3 corresponds to the total amount of processing delay in the multiplier 23, the DAC 13, the up-converter 14, the PA 15, the coupler 16, the down-converter 17, and the ADC 18. Thus, the transmission baseband signal In(t) as the reference signal and the feedback signal FB(t) corresponding to the transmission baseband signal In(t) are input to the phase adjusting unit 29 at the same time.

The phase adjusting unit 29 matches the phase of the transmission baseband signal In(t) as the reference signal and the feedback signal FB(t) and then outputs to the comparing unit 30.

The comparing unit 30 compares the transmission baseband signal In(t) as the reference signal and the feedback signal FB(t) to calculate an error signal e(t) of the both signals, and outputs the calculated error signal e(t) to the compensation-coefficient calculating unit 31.

The compensation-coefficient calculating unit 31 calculates an update value of the distortion compensation coefficient based on the error signal e(t) that is received from the comparing unit 30 and the distortion compensation coefficient that is received through the delay unit 27, and outputs the calculated update value of the distortion compensation coefficient to the updating unit 35.

Operation Example of Distortion Compensation Apparatus

Figure 6:
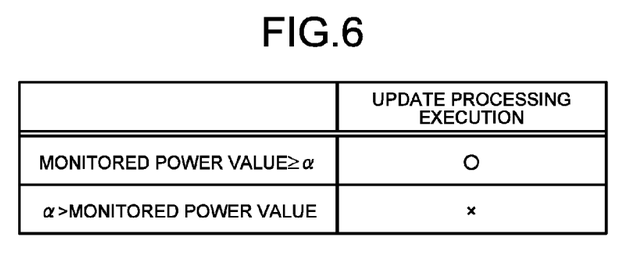
FIG. 6 is a diagram for explaining operation of processing by the distortion compensation apparatus of the first embodiment.

An example of operation of processing by the distortion compensation apparatus 12 that has the above configuration. Particularly, the update control processing of the update control unit 26 is explained here. FIG. 6 is a diagram for explaining operation of processing by the distortion compensation apparatus of the first embodiment.

The update control unit 26 compares a monitored power value (that is, a detected power value) that is received from the monitor unit 25 and a value $\alpha$ (that is, the first threshold).

As indicated in FIG. 6, the update control unit 26 does not allow the updating unit 35 to perform the update processing when the monitored power value received from the monitor unit 25 is lower than the value $\alpha$.

On the other hand, as indicated in FIG. 6, the update control unit 26 causes the updating unit 35 to perform the update processing when the monitored power value received from the monitor unit 25 is equal to or higher than the value $\alpha$. The update control unit 26 may perform control to suspend a part or all of the processing by the phase adjusting unit 29, the comparing unit 30, and the compensation-coefficient calculating unit 31, during a period in which the update processing of the updating unit 35 is suspended.

As described above, according to the present embodiment, in the distortion compensation apparatus 12, the monitor unit 25 monitors a power value of a transmission baseband signal. When the power value monitored by the monitor unit 25 is lower than the first threshold, the update control unit 26 does not allow the updating unit 35 to perform the update processing, and when equal to or higher than the first threshold, causes the updating unit 35 to perform the update processing. That is, the update control unit 26 controls execution/non-execution of the update processing by the updating unit 35 based on a monitored power value.

By this configuration of the distortion compensation apparatus 12, update of a distortion compensation coefficient can be suspended when there is high possibility that a feedback signal is buried in a noise component because the power value of a transmission baseband signal is small and there is high possibility that the calculation accuracy of distortion compensation coefficients is deteriorated. This enables to prevent deterioration in accuracy of the distortion compensation processing, and to achieve stable distortion compensation.

Second Embodiment

In a second embodiment, the "address correspondence table" is switched based on a power value of an input transmission signal (that is, a transmission baseband signal).

Figure 7:
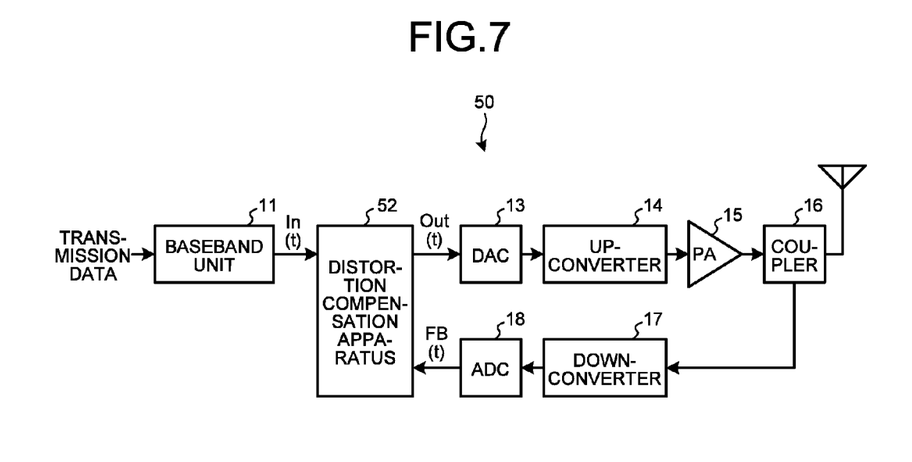
FIG. 7 is a block diagram indicating one example of a wireless transmission apparatus that includes a distortion compensation apparatus of a second embodiment.
Figure 8:
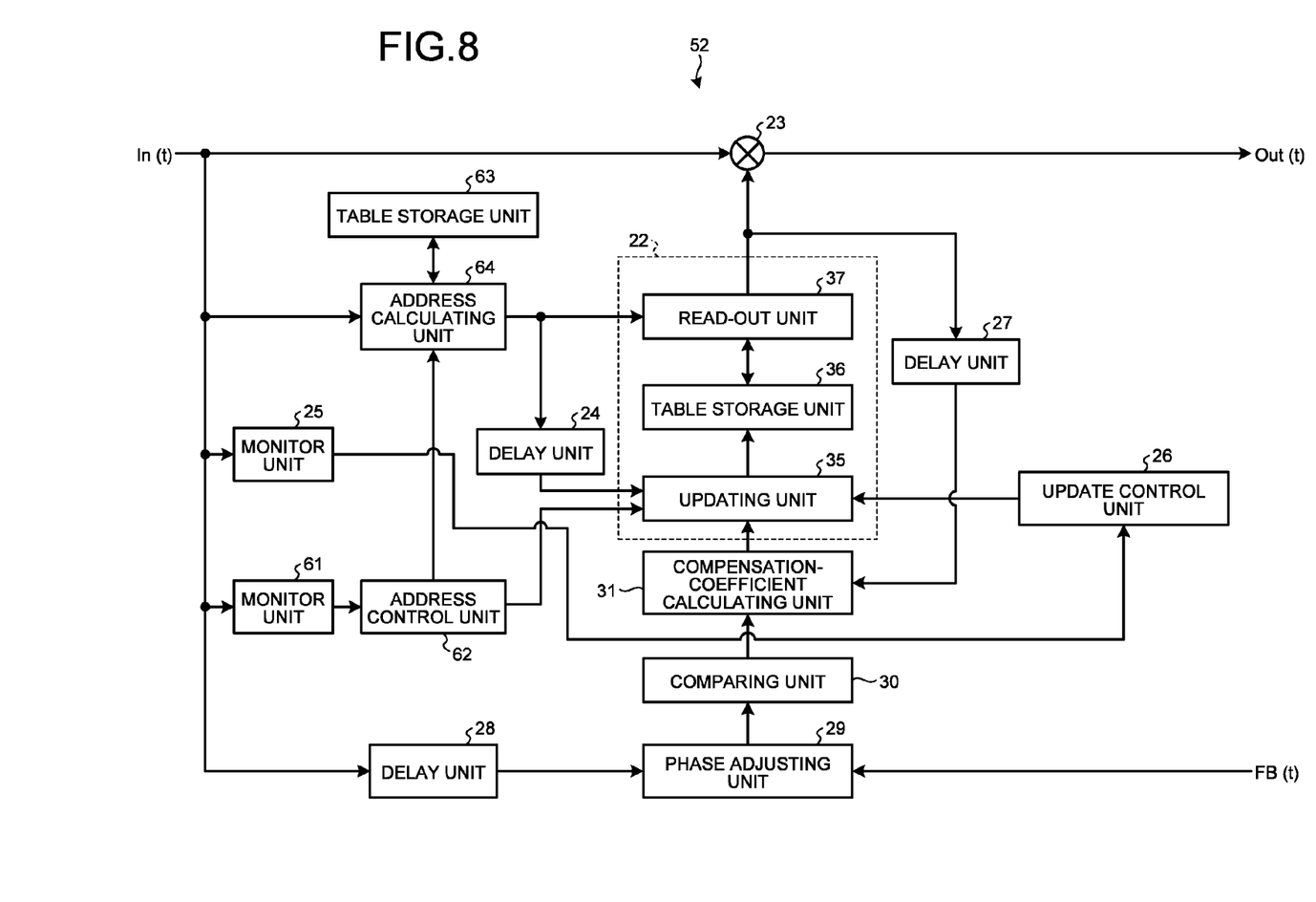
FIG. 8 is a block diagram indicating one example of the distortion compensation apparatus of the second embodiment.

Configuration Example of Wireless Transmission Apparatus and Distortion Compensation Apparatus FIG. 7 is a block diagram indicating one example of a wireless transmission apparatus that includes a distortion compensation apparatus of the second embodiment. FIG. 8 is a block diagram indicating one example of the distortion compensation apparatus of the second embodiment.

As indicated in FIG. 7, a wireless transmission apparatus 50 includes a distortion compensation apparatus 52. As indicated in FIG. 8, the distortion compensation apparatus 52 includes a monitor unit 61, an address control unit 62, a table storage unit 63, and an address calculating unit 64.

The monitor unit 61 detects (monitors) a power value of the transmission baseband signal In(t). For example, the monitor unit 61 calculates an average power value of the transmission baseband signals In(t) that are received in a "subject period" for each "subject period", and outputs the calculated average power value as a monitored power value to the address control unit 62. The "subject period" has a time length of, for example, 10 milliseconds. Furthermore, the "subject period" may be repeated in a T-second cycle that is longer than the time length of the "subject period". That is, the time interval between adjacent two subject periods may be T seconds.

The address calculating unit 64 identifies (calculates) the combined address Adr(t) based on the input transmission baseband signal In(t) and the "address correspondence table" that is specified by a "table switch signal" received from the address control unit 62, and outputs the identified combined address Adr(t) to the LUT 22 and the delay unit 24.

The address control unit 62 switches "address correspondence table" to be used in the address calculating unit 64 according to the monitored power value that is received from the monitor unit 61.

For example, the address control unit 62 switches from a "first address-correspondence table" to a "second address-correspondence table" when the monitored power value in a "first subject period" is lower than a "second threshold" and the monitored power value in a "second subject period" following the "first subject period" is equal to or higher than the "second threshold". Moreover, the address control unit 62 switches from the "second address-correspondence table" to the "first address-correspondence table" when the monitored power value in the "first subject period" is equal to or higher than a "third threshold" that is lower than the "second threshold" and the monitored power value in the "second subject period" is lower than the "third threshold". In a "first region" up to an X-direction address value having a predetermined value, the "first address-correspondence table" has more number of types of combined address values that are associated with X-direction addresses than the "second address-correspondence table". On the other hand, in a "second region" in which values of X-direction addresses included therein are larger than those of the "first region", the "second address-correspondence table" has more number of types of combined address values that are associated with the X-direction addresses than the "first address-correspondence table". In other words, a median value and a mean value of a distribution of X-direction address values that are associated with combined address values are larger in the "second address-correspondence table" than in the "first address-correspondence table". Accordingly, the "first address-correspondence table" is more suitable for low power transmission than the "second address-correspondence table". That is, the "first address-correspondence table" is an address correspondence table for low power, and the "second address-correspondence table" is an address correspondence table for high power.

For example, the address control unit 62 outputs a "table switch signal" specifying the "second address-correspondence table" for high power to the address calculating unit 64 when the monitored power value in the "first subject period" is lower than the "second threshold" and the monitored power value in the "second subject period" following the "first subject period" is equal to or higher than the "second threshold". Moreover, the address control unit 62 outputs a "table switch signal" specifying the "first address-correspondence table" for low power to the address calculating unit 64 when the monitored power value in the "first subject period" is equal to or higher than the "third threshold" that is lower than the "second threshold" and the monitored power value in the "second subject period" is lower than the "third threshold".

The table storage unit 63 stores the "first address-correspondence table" and the "second address-correspondence table" described above.

Example of Operation of Distortion Compensation Apparatus

An example of operation of processing by the distortion compensation apparatus 52 having the above configuration is explained.

Figure 9:
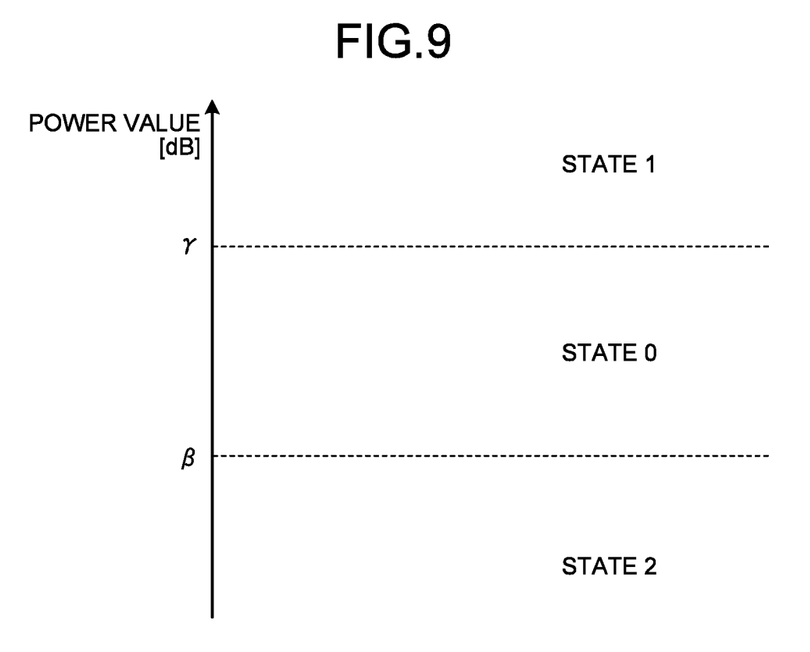
FIG. 9 is a diagram for explaining one example of operation of processing by the distortion compensation apparatus of the second embodiment.

First, outline of the operation of processing by the distortion compensation apparatus 52 of the second embodiment are explained with reference to FIG. 9. FIG. 9 is a diagram for explaining one example of operation of processing by the distortion compensation apparatus of the second embodiment.

The monitor unit 61 detects (monitors) a power value of the transmission baseband signal In(t).

The address control unit 62 switches the "address correspondence table" to be used in the address calculating unit 64 according to the monitored power value that is received from the monitor unit 61. The address control unit 62 switches the "address correspondence table" by hysteresis control. That is, in a state in which the table has been switched to the "first address-correspondence table" for low power, the address control unit 62 switches to the "second address-correspondence table" for high power only after the monitored power value in the "subject period" becomes equal to or higher than the "second threshold (threshold γ in FIG. 9)". Moreover, in a state in which the table has been switched to the "second address-correspondence table" for high power, the address control unit 62 switches to the "first address-correspondence table" for low power only after the monitored power value in the "subject period" becomes lower than the "third threshold (threshold β in FIG. 9)".

Figure 10:
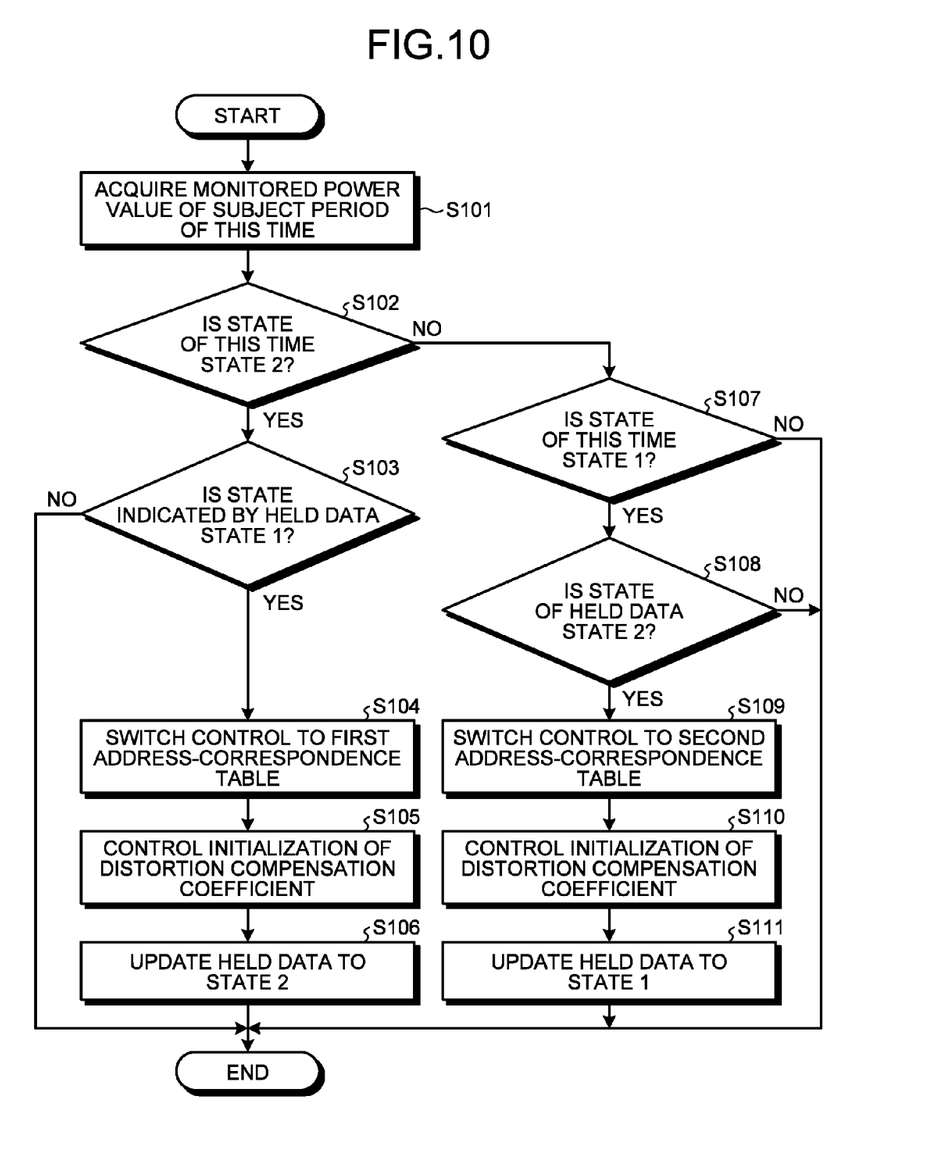
FIG. 10 is a flowchart indicating one example of operation of processing by an address control unit of the second embodiment.
Figure 11:
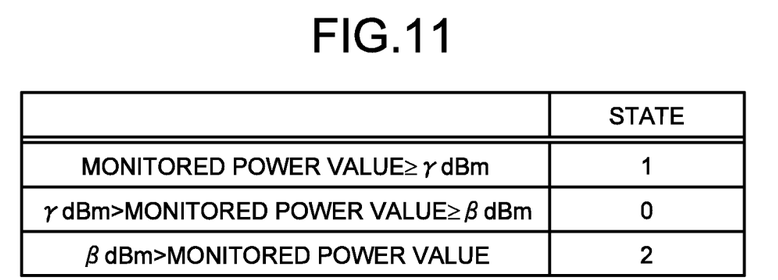
FIG. 11 is a diagram for explaining one example of the operation of processing by the address control unit of the second embodiment.
Figure 12:
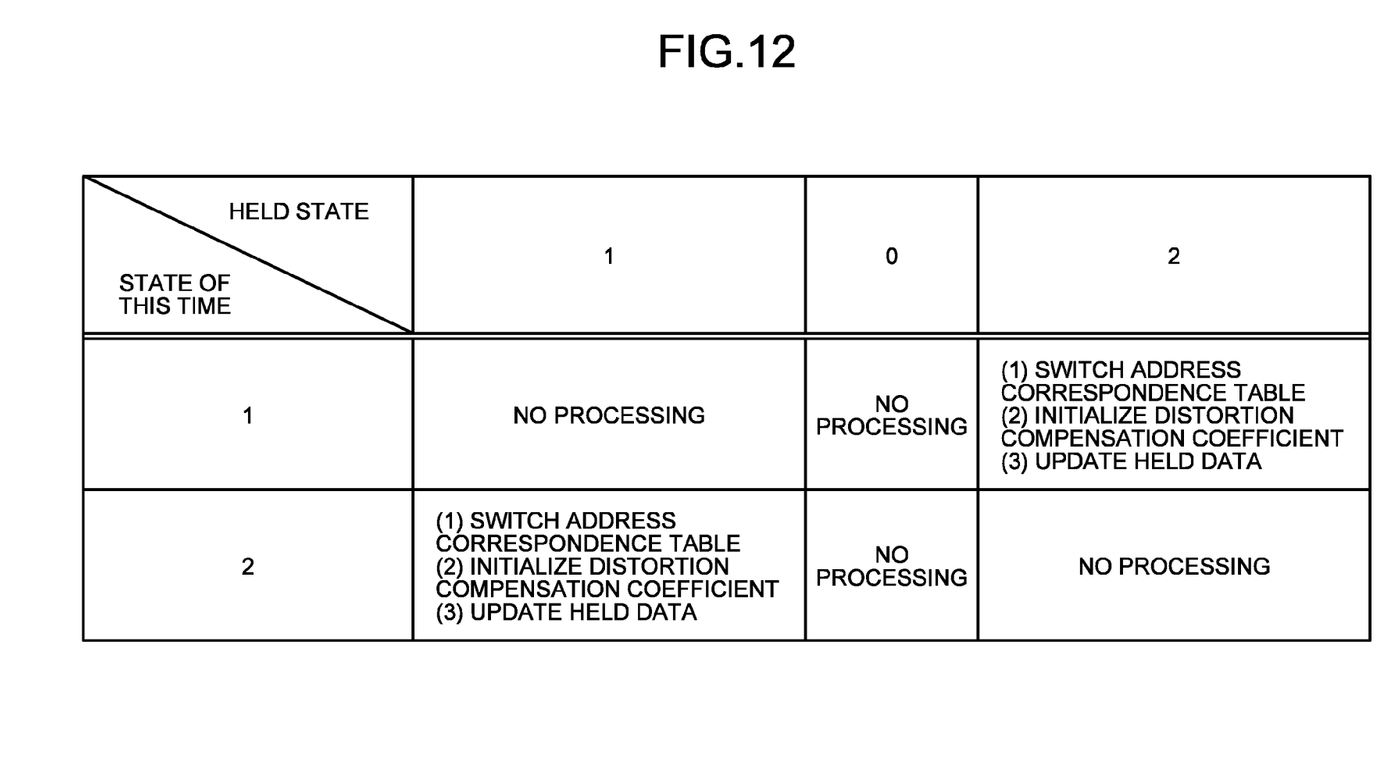
FIG. 12 is a diagram for explaining one example of the operation of processing by the address control unit of the second embodiment.

Next, a specific example of operation of the processing by the distortion compensation apparatus 52 of the second embodiment is explained. FIG. 10 is a flowchart indicating one example of operation of processing by the address control unit of the second embodiment. FIG. 11 and FIG. 12 are diagrams for explaining one example of the operation of processing by the address control unit of the second embodiment.

In FIG. 10, operation of the processing performed in one subject period is indicated. That is, operation of the processing indicated in FIG. 10 is repeated in more than one subject period.

The address control unit 62 acquires a monitored power value of a subject period of this time from the monitor unit 61 (step S101).

The address control unit 62 then determines the state of this time using the monitored power value that is acquired at step S101 and a table indicated in FIG. 11. In FIG. 11, a state in which the monitored power value is equal to or higher than the threshold γ (namely, the second threshold) is determined as "state 1", and a state in which the monitored power value is lower than the threshold β (namely, the third threshold) is determined as "state 2", and a state in which the monitored power value is equal to or higher than the threshold β and lower than the threshold γ is determined as "state 0".

The address control unit 62 then determines whether the state of this time is state 2 (step S102).

When the state of this time is state 2, (step S102: YES), the address control unit 62 determines whether a state indicated by "held data" that is held in a memory (not illustrated) that is included in the address control unit 62 is state 1 (step S103).

When the sate indicated by the held data is state 1 (step S103: YES), the address control unit 62 performs switch control to switch from the second address-correspondence table for high power to the first address-correspondence table for low power (step S104). That is, the address control unit 62 outputs the table switch signal specifying the first address-correspondence table for low power to the address calculating unit 64.

The address control unit 62 then controls initialization of a distortion compensation coefficient in the distortion-compensation coefficient table stored in the table storage unit 36 (step S105).

The address control unit 62 updates the held data to state 2 (step S106).

When the state of this time is not state 2 (step S102: NO), the address control unit 62 determines whether the state of this time is state 1 (step S107).

When the state of this time is state 1 (step S107 YES), the address control unit 62 determines whether the state indicated by the "held data" is state 2 (step S108).

When the state indicated by the held data is state 2 (step S108: YES), the address control unit 62 performs switch control to switch from the first address-correspondence table for low power to the second address-correspondence table for high power (step S109). That is, the address control unit 62 outputs the table switch signal specifying the second address-correspondence table for high power to the address calculating unit 64.

The address control unit 62 then controls initialization of a distortion compensation coefficient in the distortion-compensation coefficient table stored in the table storage unit 36 (step S110).

The address control unit 62 then updates the held data to state 1 (step S111).

When the state indicated by the held data is not state 1 (step S103: NO), when the state of this time is not state 1 (step S107: NO), and when the state indicated by the held data is not state 2 (step S108: NO), the address control unit 62 performs no particular processing, and the processing step in the subject period of this time is ended. An operation matrix in which the above processing operation is summarized is indicated in FIG. 12.

Figure 13:
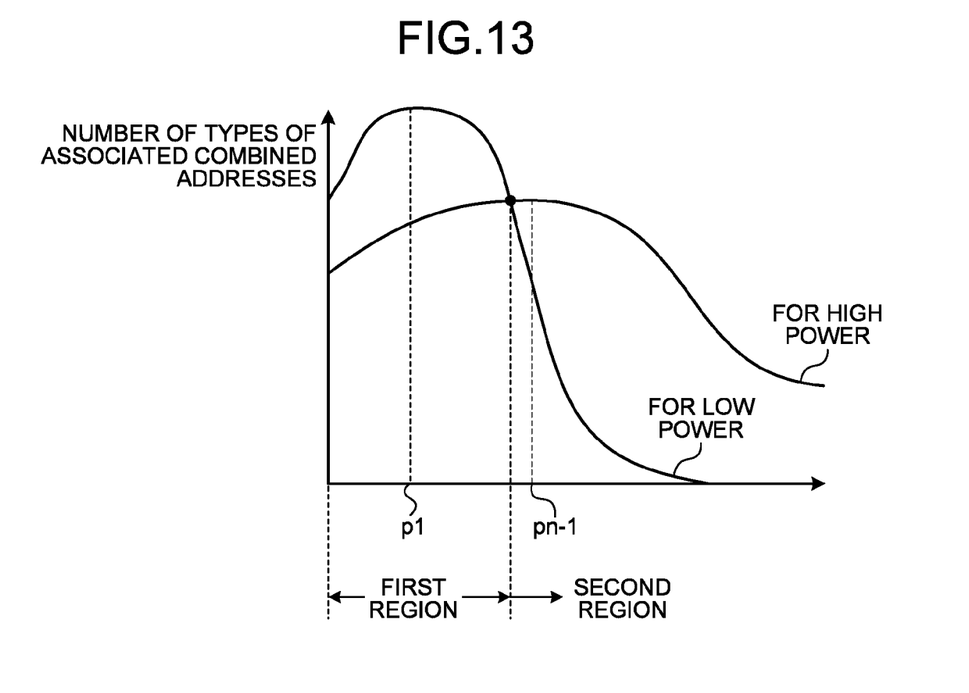
FIG. 13 is a chart for comparing a first and a second address-correspondence tables of the second embodiment.

Characteristics of the "first address-correspondence table" and the "second address-correspondence table" are explained. FIG. 13 is a chart for comparing the first and the second address-correspondence tables of the second embodiment.

As indicated in FIG. 13, in the "fist region" up to an X-direction address having a predetermined value, the "second address-correspondence table" for high power has more number of types of combines address values that are associated with X-direction addresses than the "first address-correspondence table" for low power. ON the other hand, in the "second region" in which values of X-direction addresses included therein are larger than those of the "first region", the "second address-correspondence table" for high power has more number of types of combined address values that are associated with the X-direction addresses than the "first address-correspondence table" for low power. In other words, a median value and a mean value of a distribution of X-direction address values that are associated with combined address values are larger in the "second address-correspondence table" for high power than in the "first address-correspondence table" for low power. By switching the "first address-correspondence table" and the "second address-correspondence table" as described based on a monitored power value, it is possible to switch to the address correspondence table that is suitable for a power model (for example, a power distribution) of transmission baseband signals. As a result, time required until distortion converges can be reduced without diverging the distortion in the distortion compensation processing.

As described above, according to the present embodiment, in the distortion compensation apparatus 52, the monitor unit 61 detects (monitors) the power value of the transmission baseband signal In(t). The address control unit 62 switches the "address correspondence table" to be used in the address calculating unit 64 according to the monitored power value that is received from the monitor unit 61.

By this configuration of the distortion compensation apparatus 52, it is possible to switch to an address correspondence table that is suitable for a power model of transmission baseband signals. As a result, time required until distortion converges can be reduced without diverging the distortion in the distortion compensation processing.

Furthermore, in the distortion compensation apparatus 52, the address control unit 62 switches from the "first address-correspondence table" to the "second address-correspondence table" when the monitored power value in the "first subject period" is lower than the "second threshold" and the monitored power value in the "second subject period" following the "first subject period" is equal to or higher than the "second threshold". Moreover, the address control unit 62 switches from the "second address-correspondence table" to the "first address-correspondence table" when the monitored power value in the "first subject period" is equal to or higher than the "third threshold" that is lower than the "second threshold" and the monitored power value in the "second subject period" is lower than the "third threshold". That is, the address control unit 62 performs hysteresis switch control.

By this configuration of the distortion compensation apparatus 52, excessively frequent switching can be prevented.

Another Embodiment

Respective components of respective units illustrated in the first embodiment and the second embodiment are not necessarily required to be configured physically as illustrated. That is, a specific form of distribution/integration of the respective units is not limited to the illustrated one, and all or a part thereof can be distributed/integrated functionally or physically in an arbitrary unit according to various kinds of loads, use conditions, or the like.

Furthermore, various kinds of processing functions implemented in each device may be arranged such that all or an arbitrary part thereof is performed on a central processing unit (CPU) (or on a microcomputer such as a micro processing unit (MPU) and a micro controller unit (MCU)). Alternatively, the various kinds of processing functions may be arranged such that all or an arbitrary part thereof is performed on a program that is analyzed and executed by a CPU (or a microcomputer such as an MPU and an MCU), or on hardware by wired logic.

The distortion compensation apparatus of the first embodiment and the second embodiment can be implemented by, for example, a hardware configuration as follows.

Figure 14:
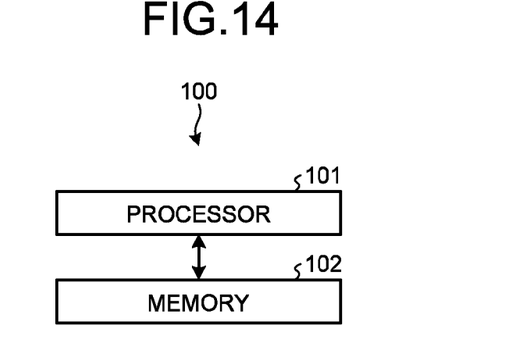
FIG. 14 indicates an example of a hardware configuration of the distortion compensation apparatus.

FIG. 14 indicates an example of a hardware configuration of the distortion compensation apparatus. As indicated in FIG. 14, a distortion compensation apparatus 100 includes a processor 101 and a memory 102. As an example of the processor 101, a CPU, a digital signal processor (DSP), a field programmable gate array (FPGA), and the like are considered. Moreover, an example of the memory 102, a random access memory (RAM) such as a synchronous dynamic random access memory (SDRAM), a read only memory (ROM), a flash memory, and the like are considered.

Furthermore, the various kinds of processing performed in the distortion compensation apparatuses of the first embodiment and the second embodiment may be implemented by executing a program that is stored in various kinds of memory such as a nonvolatile storage medium by a processor. Specifically, a program that corresponds to each processing performed by the address calculating units 21, 64, the updating unit 35, the read-out unit 37, the multiplier 23, the delay units 24, 27, 28, the monitor unit 25, 61, and each program may be executed by the processor 101. Moreover, the table storage units 32, 36, 63 are implemented by the memory 102.

Although it is assumed that the various kinds of processing functions performed by the distortion compensation apparatuses of the first embodiment and the second embodiment are implemented by a single unit of the processor 101 here, it is not limited thereto, and may be implemented by more than one processor.

According to a disclosed aspect, stable distortion compensation can be achieved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation method of compensating nonlinear distortion generated in an amplifier configured to amplify power of a transmission signal to output, using a distortion compensation coefficient, the distortion compensation method comprising:

calculating an update value of the distortion compensation coefficient based on an input transmission signal and an output signal of the amplifier that corresponds to the input transmission signal;

controlling not to execute update processing when a power value of the input transmission signal is lower than a first threshold, and to execute the update processing when the power value of the input transmission signal is equal to or higher than the first threshold, the update processing to update a distortion-compensation coefficient table in which a plurality of distortion compensation coefficients corresponding to a plurality of first address values are stored, using the calculated update value;

switching an address correspondence table in which a plurality of combinations of a second address value that corresponds to a power value candidate of the input transmission signal and a third address value that corresponds to a phase candidate of the input transmission signal are associated respectively with the first address values, according to a power value of the input transmission signal;

calculating the first address value based on the input transmission signal and the switched address correspondence table; and reading out a distortion compensation coefficient that corresponds to the calculated first address in the distortion-compensation coefficient table to multiply the input transmission signal by the read distortion compensation coefficient.

2. The distortion compensation method according to claim 1, wherein switching an address correspondence table includes:

switching from a first address-correspondence table to a second address-correspondence table when a power value of a transmission signal that is input in a first period is lower than a second threshold and a power value of a transmission signal that is input in a second period later than the first period is equal to or higher than the second threshold, and switching from the second address-correspondence table to the first address-correspondence table when the power value of the transmission signal that is input in the first period is equal to or higher than a third threshold that is lower than the second threshold and the power value of the transmission signal that is input in the second period is lower than the third threshold.

3. A distortion compensation apparatus that compensates nonlinear distortion generated in an amplifier configured to amplify power of a transmission signal to output, using a distortion compensation coefficient, the distortion compensation apparatus comprising:

a memory; and a processor coupled to the memory and configured to execute a process comprising:

calculating an update value of the distortion compensation coefficient based on an input transmission signal and an output signal of the amplifier that corresponds to the input transmission signal;

controlling not to execute update processing when a power value of the input transmission signal is lower than a first threshold, and to execute the update processing when the power value of the input transmission signal is equal to or higher than the first threshold, the update processing to update a distortion-compensation coefficient table in which a plurality of distortion compensation coefficients corresponding to a plurality of first address values are stored, using the calculated update value;

switching an address correspondence table in which a plurality of combinations of a second address value that corresponds to a power value candidate of the input transmission signal and a third address value that corresponds to a phase candidate of the input transmission signal are associated respectively with the first address values, according to a power value of the input transmission signal;

calculating the first address value based on the input transmission signal and the switched address correspondence table; and reading out a distortion compensation coefficient that corresponds to the calculated first address in the distortion-compensation coefficient table to multiply the input transmission signal by the read distortion compensation coefficient.

4. A non-transitory computer readable storage medium having stored therein a distortion compensation program causing a distortion compensation apparatus that compensates nonlinear distortion generated in an amplifier configured to amplify power of a transmission signal to output, using a distortion compensation coefficient to execute a process comprising:

calculating an update value of the distortion compensation coefficient based on an input transmission signal and an output signal of the amplifier that corresponds to the input transmission signal;

controlling not to execute update processing when a power value of the input transmission signal is lower than a threshold, and to execute the update processing when the power value of the input transmission signal is equal to or higher than the threshold, the update processing to update a distortion-compensation coefficient table in which a plurality of distortion compensation coefficients corresponding to a plurality of address values are stored, using the calculated update value;

switching an address correspondence table in which a plurality of combinations of a second address value that corresponds to a power value candidate of the input transmission signal and a third address value that corresponds to a phase candidate of the input transmission signal are associated respectively with the first address values, according to a power value of the input transmission signal;

calculating the first address value based on the input transmission signal and the switched address correspondence table; and reading out a distortion compensation coefficient that corresponds to the calculated first address in the distortion-compensation coefficient table to multiply the input transmission signal by the read distortion compensation coefficient.

* * * * *